United States Patent
Skjermo et al.

(10) Patent No.: US 10,459,026 B2
(45) Date of Patent: Oct. 29, 2019

(54) DAMAGE PREVENTING IDENTIFICATION SYSTEM FOR CONDUCTORS AND COUPLING POINTS IN ELECTRICAL SYSTEMS WITH DATA ACQUISITION

(71) Applicant: EL-WATCH AS, Rindal (NO)

(72) Inventors: Tor Öistein Skjermo, Rindal (NO); Ole Furuhaug, Rindalsskogen (NO)

(73) Assignee: EL-WATCH AS, Rindal (NO)

( * ) Notice: Subject to any disclaimer, the term of this patent is extended or adjusted under 35 U.S.C. 154(b) by 140 days.

(21) Appl. No.: 15/323,759

(22) PCT Filed: Jun. 16, 2015

(86) PCT No.: PCT/NO2015/050108
§ 371 (c)(1),
(2) Date: Jan. 4, 2017

(87) PCT Pub. No.: WO2016/007013
PCT Pub. Date: Jan. 14, 2016

(65) Prior Publication Data
US 2017/0146586 A1    May 25, 2017

(30) Foreign Application Priority Data
Jul. 7, 2014   (NO) .................................... 20140862

(51) Int. Cl.
*G01R 31/08* (2006.01)
*G01K 1/14* (2006.01)
(Continued)

(52) U.S. Cl.
CPC ........... *G01R 31/086* (2013.01); *G01K 1/024* (2013.01); *G01K 1/14* (2013.01); *G01R 15/183* (2013.01);
(Continued)

(58) Field of Classification Search
CPC ......... H04B 1/00; H04B 2201/00; G06F 1/00; G06F 2101/00; G01K 1/00; G01K 2201/00
(Continued)

(56) References Cited

U.S. PATENT DOCUMENTS

| 4,384,289 A | 5/1983 | Stillwell et al. |
| 2002/0063565 A1* | 5/2002 | Stroth ................ G01R 31/3277 324/536 |

(Continued)

FOREIGN PATENT DOCUMENTS

| EP | 1991027 A2 | 11/2008 |
| EP | 2270452 A2 | 1/2011 |

(Continued)

OTHER PUBLICATIONS

International Search Report and Written Opinion dated Oct. 15, 2015 (PCT/NO2015/050108).

*Primary Examiner* — Jermele M Hollington
*Assistant Examiner* — Temilade S Rhodes-Vivour
(74) *Attorney, Agent, or Firm* — Alix, Yale & Ristas, LLP

(57) ABSTRACT

Damage preventing identification system for electrical conductors and coupling points including at least one identification unit arranged for arrangement to a surface, end cap or cable shoe of an electrical conductor, which identification unit is provided with an encapsulation for arrangement of the identification unit to the electrical conductor, and for housing means for visual and electronic tagging, which identification unit further includes means for measuring temperature and/or current.

20 Claims, 6 Drawing Sheets

(51) Int. Cl.
- *G08C 17/02* (2006.01)
- *G01K 1/02* (2006.01)
- *H01B 7/36* (2006.01)
- *H02J 7/02* (2016.01)
- *G01R 15/18* (2006.01)
- *H02H 5/04* (2006.01)
- *H02H 7/22* (2006.01)
- *G01R 31/04* (2006.01)

(52) U.S. Cl.
CPC ............ *G08C 17/02* (2013.01); *H01B 7/368* (2013.01); *H02J 7/025* (2013.01); *G01R 31/041* (2013.01); *H02H 5/041* (2013.01); *H02H 7/226* (2013.01)

(58) Field of Classification Search
USPC ........................................................ 324/538
See application file for complete search history.

(56) References Cited

U.S. PATENT DOCUMENTS

| | | | |
|---|---|---|---|
| 2006/0019540 A1* | 1/2006 | Werthman | G01K 1/14 439/488 |
| 2006/0077607 A1* | 4/2006 | Henricks | G06Q 10/06 361/93.1 |
| 2006/0087322 A1 | 4/2006 | McCollough, Jr. | |
| 2008/0042794 A1* | 2/2008 | Darr | H01H 9/168 337/143 |
| 2009/0272794 A1 | 11/2009 | Lange et al. | |
| 2010/0225497 A1* | 9/2010 | Marincak | G01N 27/24 340/657 |
| 2011/0084839 A1 | 4/2011 | Groth et al. | |
| 2011/0260735 A1* | 10/2011 | McCabe | G01R 31/021 324/543 |
| 2012/0268290 A1 | 10/2012 | Huang et al. | |
| 2013/0213129 A1* | 8/2013 | Kumar | E21B 47/0006 73/152.47 |

FOREIGN PATENT DOCUMENTS

| | | | |
|---|---|---|---|
| JP | 2008282264 A | 11/2008 | |
| JP | 2009003490 A | 1/2009 | |
| JP | 2013003738 A | 1/2013 | |
| WO | WO 2004003497 A2 * | 1/2004 | ............ G01K 1/026 |
| WO | 2010026161 A2 | 3/2010 | |
| WO | 2012044175 A1 | 4/2012 | |
| WO | 2012052606 A1 | 4/2012 | |
| WO | 2013030796 A2 | 3/2013 | |

* cited by examiner

DAMAGE PREVENTING IDENTIFICATION SYSTEM FOR CONDUCTORS AND COUPLING POINTS IN ELECTRICAL SYSTEMS WITH DATA ACQUISITION

BACKGROUND

The disclosure is related to a damage preventing identification system for conductors and possibly coupling points in electrical plants.

More particularly, the disclosure is related to an identification system which in addition to visual and electrical tagging of conductors and possibly coupling points in electrical plants which is arranged for damage prevention by that the tagging itself is arranged for continuous measurement, logging and warning of temperature and/or current, Fire yearly causes high economic losses, and many of the fires arise due to fault in electrical equipment or components as a consequence of faults in components, incorrect use of components, incorrect installation, age and wear and tear. Particularly poor electrical connection in coupling points stands out as a cause, something which results in that flame arcs arise.

The first indication of poor contact is overheating, and if this overheating is persistent corrosive gases can be developed which increases the connection resistance in the coupling point. After a time there will be so high resistance that a flame arc arises. This flame arc can be very hot and easily ignite inflammable goods nearby.

Today, there are demands for periodic control of all electrical plants, where the frequency of such plants is based on risk evaluation of the plant. Such controls are usually performed with thermo-photographing which is capable of revealing abnormal heat development.

There are increasing needs for continuous control and opportunities to detect fault sources more rapidly as downtime due to this, results in high economic losses for the industry, so that it is important to provide systems which are capable of providing warning at an early stage. For the users to be willing to invest in such systems it is further preferable that they have as low costs as possible, and that they are flexible.

Another desire from the users will be that systems like these can be installed and maintained with a minimal use of professional personnel.

This has resulted in that some systems have been developed which tries to solve this need, among others, based on FID technology combined with temperature measurements.

WO2012/052606 A1 is related to a device for monitoring temperature by means of temperature sensor and RFID transponder, where the device can be used for monitoring temperature in electrical cables.

DE202009008896 U1 is related to a device for early detection of heat development at main power connections in electrical coupling plants, where the device includes a FID temperature sensor.

DE102008046430 A1 is related to monitoring of conductor systems, such as cables or switch units, where temperature is monitored, where the device includes sensors, data registration unit and communication interface, where the communication interface can be constituted by a RFID unit.

NO 332029 B1 is related to a system for fire monitoring in electrical plants including temperature sensors and a transmitter, where the transmitter can be an RFID chip.

JP2009003490 A is related to cable identification which is both visual and electronic by means of a RFID circuit.

JP2008282264 A describes a cable identification system which is both visual and electronic.

With solutions as described above one could get approximately continuous monitoring of electrical plants and thus be able to detect and alert about increased temperature on components and cables at an early stage. At the same time it will be less need for controls and results in increased safety for the users.

The large disadvantages with prior art is that they are either arranged for identification or arranged for temperature measurements. There is none of the prior art systems which provide a low-cost solution for both identification and monitoring with the purpose of damage prevention, at the same time as it can be installed in a simple manner and drifted by unskilled personnel by that they do not intervene in the electrical plant.

SUMMARY

The disclosed embodiments provide an identification system for electrical conductors and coupling points in electrical plants which solves the above mentioned lacks of prior art.

Also provided is an identification system which provides both visual and electronic tagging, and is capable of monitoring electrical plants and warn when indications of faults are detected.

Also provided is an identification system which easily can be adapted and arranged in the individual electrical plant without intervention in the existing electrical plant.

Also provided is an identification system which is capable of measuring temperature and/or current in electrical conductors and coupling points.

As also provided herein, the adaption to the single plant both is performed by choosing which conductors and coupling points which are to be monitored and also which parameters which are to be monitored.

The disclosed embodiments allow detection of temperature in conductors and coupling points and alert if the temperature is too high and that it should show how high the temperature is for the relevant coupling points or conductors.

The disclosed embodiments also allow measurement of temperature difference between comparable coupling points and phases, as this often is a clear indication of a fault condition.

Also provided herein is an identification system which is capable of measuring temperature both in an electrical conductor and in a coupling point of the electrical conductor.

The disclosed embodiments provide an identification system for visual and electronic tagging in the form of that it includes an identification unit which in a simple manner can be arranged to a surface of an electrical conductor in an electrical system and which includes an exterior surface for visual tagging.

The identification unit is for this provided with fastening means or a fastening device for attaching it to the conductor it is to be arranged on. The fastening device is preferably arranged for retrofittable fastening to the conductor or coupling point.

The identification unit will via the fastening means or fastening device be arranged for being attached to conductors with different design and dimension.

The identification unit is further provided with at least one built-in temperature sensor, which preferably is arranged for registering temperature in the conductor or coupling point it is arranged to, at given intervals or on request.

The identification unit can further be provided with an advanced measuring probe, e.g. through a thermal conductor which lead thermal level back to the identification unit, or e.g. distance measurement via an optical I temperature sensor (thermopile).

This result in that one can monitor both temperature in the conductor and coupling point from the one and same identification unit.

The identification unit is further provided with means for communication with a central unit, preferably in the form of wireless communication, such as radio, optical or similar, but it can also be provided with means for communication via wiring it is to measure on, by means of power line communication.

The identification unit can further be provided with an optical indicator, e.g. of the type LED-diode or similar, for communicating visually, e.g. for informing that there is an indication of fault for the mentioned conductor or nearby coupling point.

Alternatively or in addition, the identification unit can be provided with a graphic panel arranged for communicating with signs and/or light.

Each identification unit is provided with a separate identification number and is arranged for transmitting identification number together with measured temperature from temperature sensor(s) after given criteria or on request from a central unit belonging to the system.

The central unit of the system is provided with means and/or software for evaluating risk for overheating, fire or operational deviation based on temperature measured by identification units arranged to conductors.

The central unit should further be provided with means and/or software for reporting and alerting operator/operation manager.

Alternatively or in addition, the identification units are arranged for mutual communication and provided with means and/or software for evaluating risk for overheating, fire and operational deviation based on temperature measured by identification units arranged to conductors and reporting to central unit or a warning central if indications of fault are present.

In electrical plants, temperature deviation over component (fuse, contactor, etc.) on the same phase is monitored by the identification units or the central unit, something which isolated can give a warning of fault even if temperature per point has not exceeded a critical limit.

In electrical plants including several phases, temperature deviation between the phases on the same circuit is monitored by the identification units or central unit, something which isolated could give a warning even if temperature per point has not exceeded a critical limit.

The identification units can be passive units, active units or semi-passive. Active units require energy supply. The identification units can be energy supplied from internal batteries or from external energy sources by means of energy harvesting, e.g. from RF energy, electromagnetic field, solar cell, thermal energy, vibration, current transducer or similar.

Independent if the identification units are active, passive or semi-passive they can be arranged for forwarding data from other identification units with thought of extending the range of the tag network.

The identification unit can further include a ferrite core which can act both as noise suppressor on the conductor and as a combined temperature sensor and current sensor, alternatively one of the functions.

The identification unit can further include a current transducer which can measure current in the conductor together with temperature for quality assurance of the measuring result. By phase comparison it can be favorable to know the current drawn on each phase, as higher currents naturally will result in increased temperature in conductor/coupling point. (Arises e.g. in uneven distributed three-phase plant).

The disclosed embodiments allow a simple installation, which could cover all connection points and at the same time be a part of required cable tagging.

The measuring principle in the disclosed embodiments is primarily based on measuring temperature in the conductor/coupling point by means of the temperature sensor in the identification unit.

The measuring principle can further include measuring temperature in both conductor and a nearby coupling point of the relevant conductor and comparing these.

By this is achieved continuous reading of temperature of a conductor/coupling point and evaluating if the temperature constitutes a risk for the installation. By measuring on electric circuits it will be important to measure the temperature difference between the phases for revealing fault in individual connection points. Also temperature differences against other coupling points will be important indicators about fault/arising faults.

Further preferable features and advantageous details of the present invention will appear from the following example description.

BRIEF DESCRIPTION OF THE DRAWINGS

The disclosed embodiments will below be described in further detail with references to the attached drawings, where.

DETAILED DESCRIPTION

Figure 1:
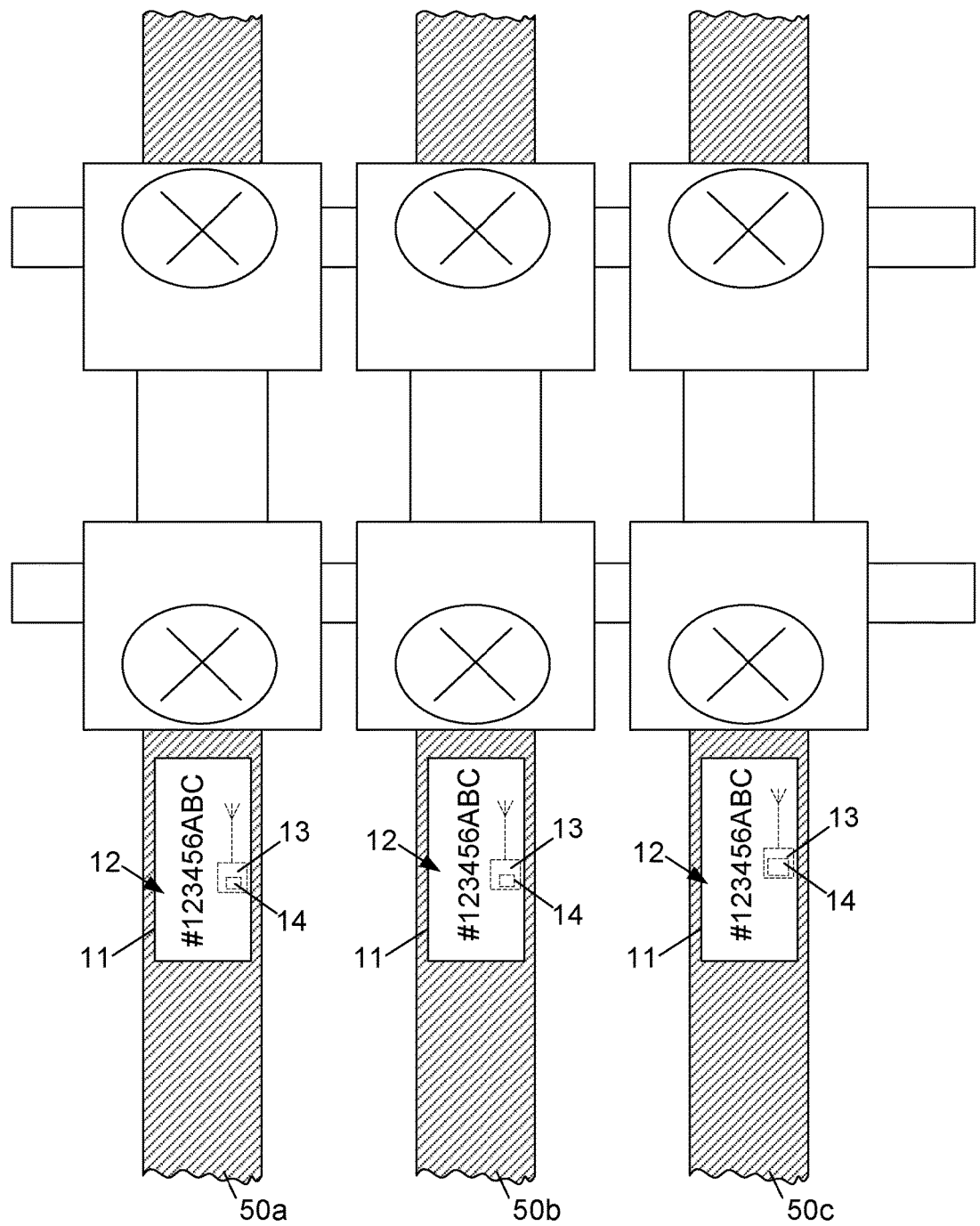
FIG. 1 is a principle drawing of a first embodiment of an identification system according to the disclosure.

Reference is now made to FIG. 1 which shows a first embodiment of an identification system. As shown, at least one identification unit 10 is arranged to each conductor or phase 50*a-c* in an electrical plant. In the depiction, there are shown three conductors 50*a-c*, but it can just as well be an electrical system including only one conductor 50*a*.

In the first embodiment shown in FIG. 1 the identification unit 10 includes an encapsulation 11 with an exterior surface 12 for visual tagging in the form of visible letters, numbers, bar codes or similar, and is provided with an electronic tag 13, where the electronic tag 13 includes at least one temperature sensor 14. The electronic tag 13 is preferably arranged for wireless communication via radio, optical, RFID (a RFID chip) or similar. The electronic tag 13 can also be arranged for communication via the wiring by that it in addition or instead for wireless communication communicates via so-called power line communication. The temperature sensor(s) 14 is/are preferably miniaturized temperature sensors with wireless communication which get their operational power from battery or induction circuits via the electronic tag 13. The temperature sensors 14 are arranged for continuous measuring, measuring at given intervals or at request of the temperature of the conductor 50a-c, and can be arranged for evaluating if the measured temperature constitutes a risk for the installation. At measurement on electrical circuits, i.e. where there are several conductors/phases 50a-c, it will be important to measure the temperature difference between the conductors/phases 50a-c to be able to discover fault in separate coupling points.

The temperatures can be processed locally in the sensor or be sent to a central unit 100 for logging and warning.

Figure 2:
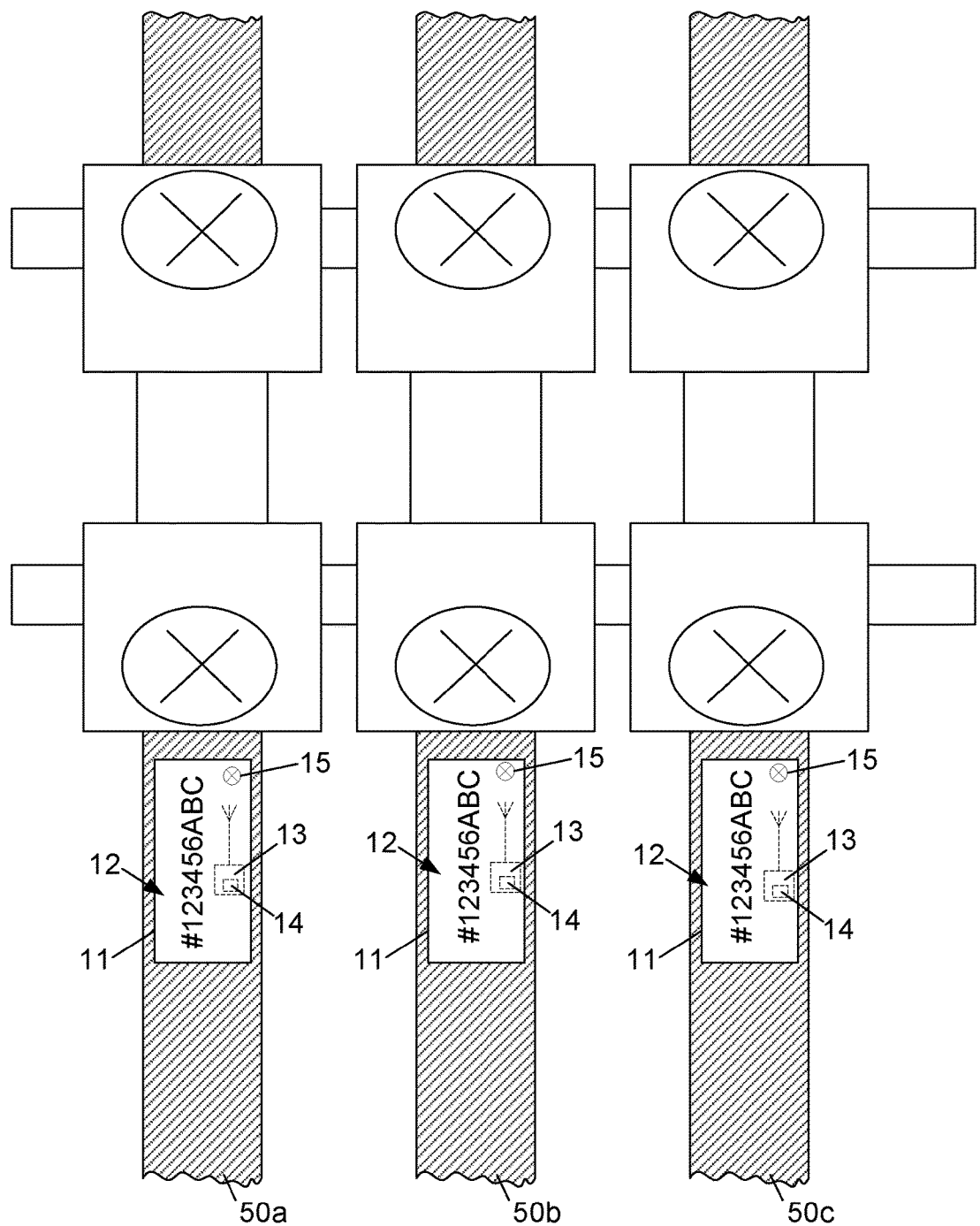
FIG. 2 is a principle drawing of a second embodiment of an identification system according to the disclosure.

Reference is now made to FIG. 2 which shows a second embodiment of an identification system according to the disclosure. In the second embodiment the identification unit 10 in addition to the above mentioned includes at least one optical indicator 15, e.g. in the form of a LED-diode or similar, which is arranged for visually indicating which conductor 50a-c there is a fault on. The optical indicator 15 can be controlled by the central unit 100 of the identification system, a control unit arranged in the identification unit 10, the temperature sensor 14 or the electronic tag 13, and supplied with energy by the battery/batteries of the identification unit 10.

Figure 3:
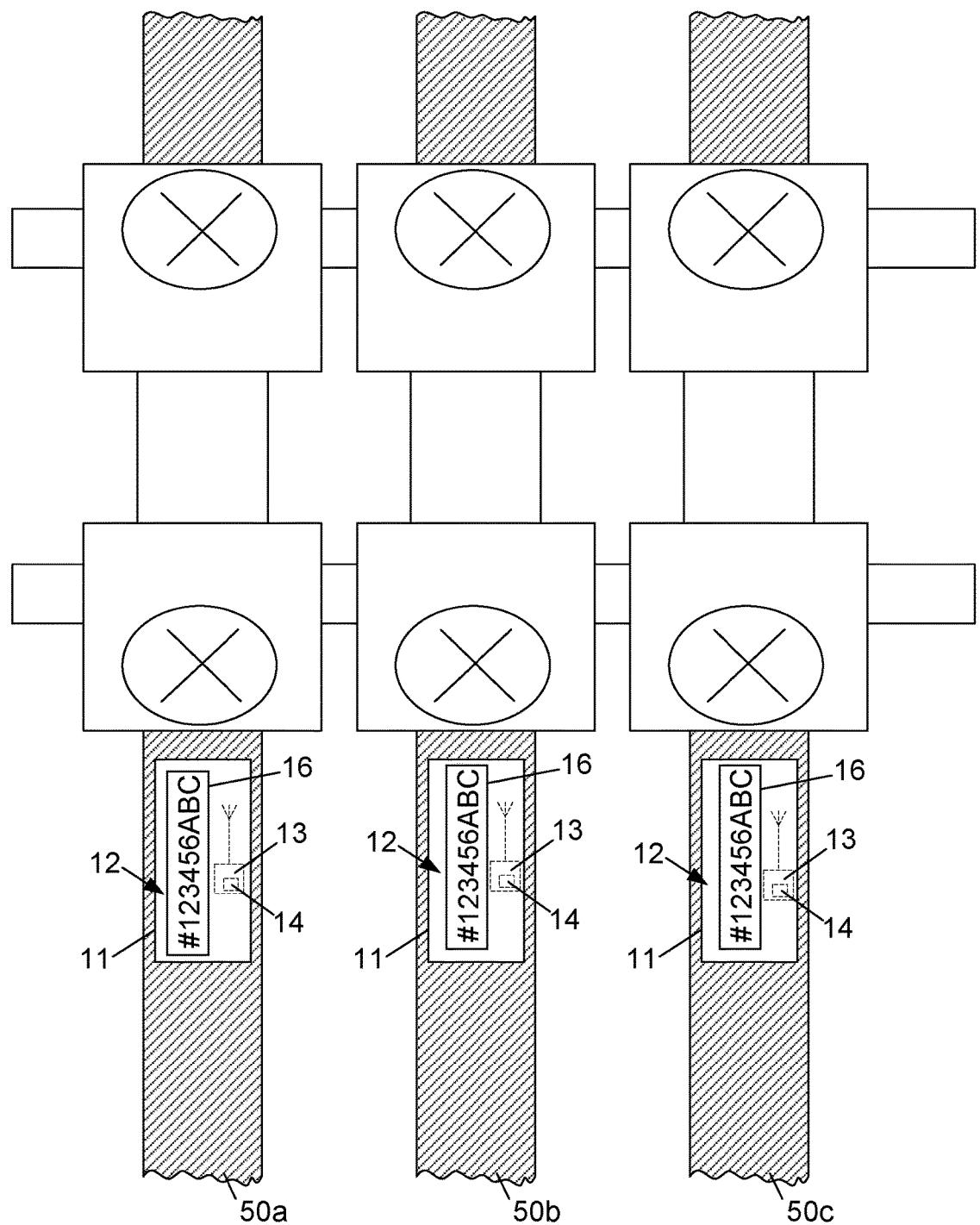
FIG. 3 is a principle drawing of a third embodiment of an identification system according to the disclosure.

Reference is now made to FIG. 3 which shows a third embodiment of an identification system according to the disclosure. In the third embodiment the identification unit 10, in addition or instead of an exterior surface 12 for visual identification in the form of visible letters, numbers, bar codes or similar, includes a graphic panel 16 of the type LCD or similar which covers the entire or parts of the exterior surface or is integrated therein, for communicating signs, bar codes or similar. Such a panel 16 could also replace the above mentioned function of the optical indicator 15. The graphic panel 16 can be controlled by the central unit 100 of the identification system, a control unit arranged in the identification unit 10, the temperature sensor 14 or the electronic tag 13, and supplied with energy by the battery/batteries of the identification unit 10.

Figure 4:
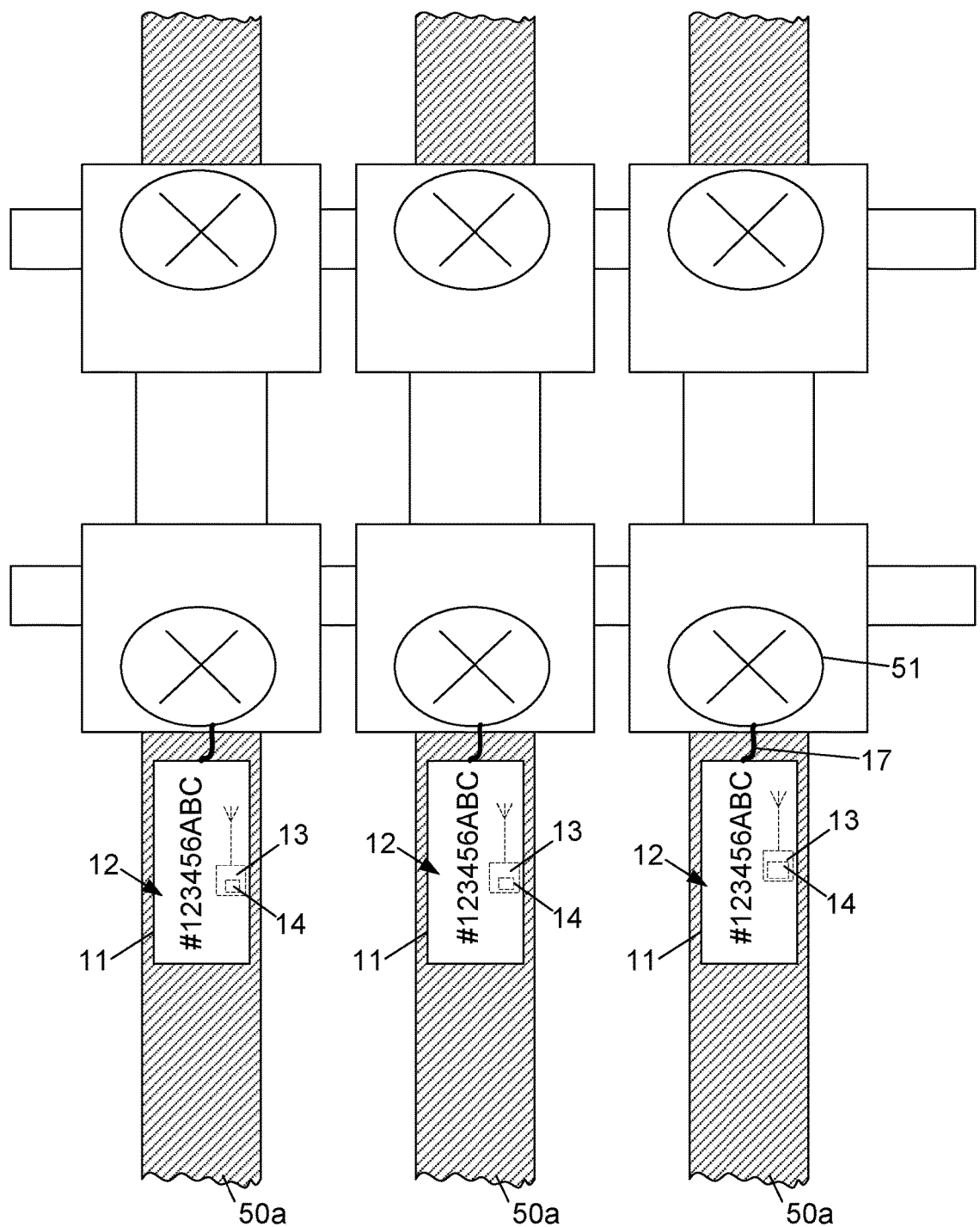
FIG. 4 is a principle drawing of a fourth embodiment of an identification system according to the disclosure.

Reference is now made to FIG. 4 which shows a fourth embodiment of an identification system according to the disclosure. According to the fourth embodiment the identification unit 10 further includes an advanced measuring probe 17, e.g. in the form of a thermal conductor which leads thermal level back to the identification unit or distance measurement via an optical IR temperature sensor (thermopile), as measuring point for connection with the conductor 50a-c in a coupling point 51. By means of the advanced measuring probe 17 one can, in addition to measure temperature in the conductor 50a-c itself, also measure temperature in the coupling point 51. As the temperature difference against the other coupling points 17 of the phase 50a-c will be important indicators about faults/arising faults, it will be advantageous to measure this in addition.

The identification unit 10 can be provided with energy by means of an energy source, e.g. in the form of that it includes batteries or by that it is supplied with energy from external energy sources through energy harvesting, such as from RF-energy, electromagnetic field, thermal energy, vibration, current transducer.

If the identification unit 10 is provided with a current transducer it can in addition to measure temperature by means of the temperature sensor(s) also measure current running through a conductor 50a-c.

The identification unit 10 can also be provided with a ferrite core. A ferrite core can be used for both measuring temperature and current, and in addition work as a current suppressor on the conductor 50a-c.

Figure 5A:
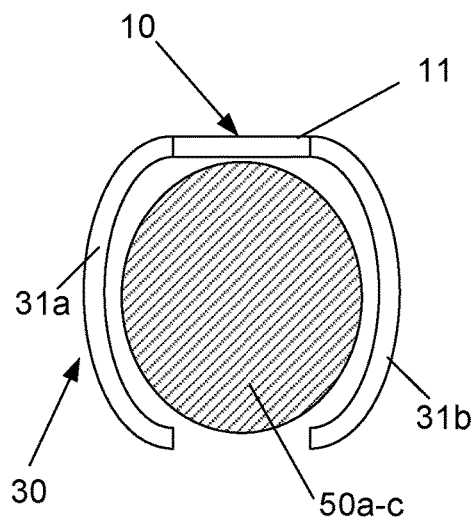
FIG. 5*a-c* show examples of a fastening device for an identification unit according to the disclosure.
Figure 5B:
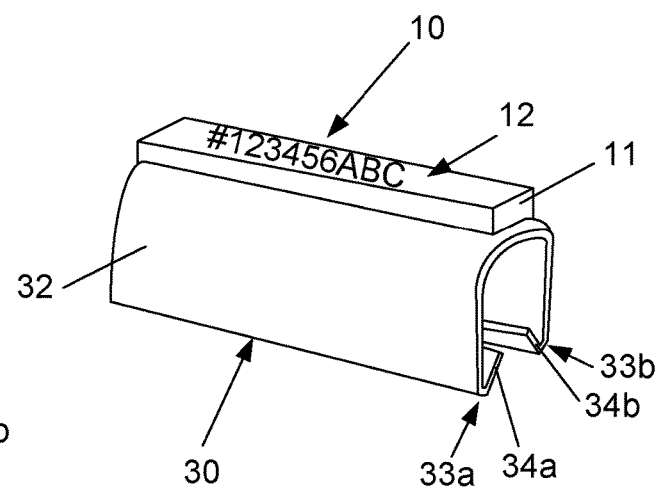
Figure 5C:
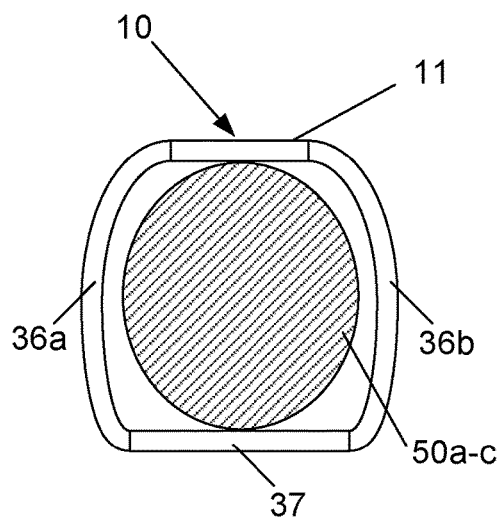

Reference is now made to FIGS. 5a-c showing some examples of an encapsulation 11 according to the disclosure. The encapsulation 11 is preferably made of a material which does not conduct current or heat, e.g. a plastic material. An example, which is not shown in detail, is that the encapsulation 11 is attached to the conductor/phase 50a-c by means of double-sided tape or glue, clip, strips or similar.

Another example is that the encapsulation 11 is arranged to or integrated in a fastening device 30, as shown in the FIGS. 5a-c. In FIG. 5a it is shown a fastening device 30 which includes two elastic U-shaped elements 31a-b which are joined by the encapsulation 11 at one side and exhibit a flexible opening at other side. In this way a conductor 50a-c can be inserted into the opening by that the elastic elements 31a-b are forced outwards and they return to their original state when the conductor 50a-b is in place between the two U-shaped elements 31a-b and thus retains the identification unit 10 securely to the conductor 50a-c.

In an alternative embodiment of this, as shown in FIG. 5b, the fastening device 30 includes a U-shaped housing 32 which at the ends of the U-shape exhibit elastic elements 34a-b which allow insertion of a conductor therein by that the elastic elements 24a-b are forced away from each other at insertion of the conductor 50a-c, and returns to their original state when the conductor 50a-c is in place in the U-shaped housing 32. The encapsulation 11 can here be integrated in the top of the U-shaped housing 32 in an appropriate way.

Another alternative to using fastening devices 30 with elastic elements 31a-b, 34a-b can be that the fastening device 30 exhibits a mainly U-shape, e.g. formed by that the encapsulation 11 is integrated with side elements 36a-b, similar to the solution of FIG. 5a, or that the encapsulation is provided with a U-shaped housing 32, similar to the solution in FIG. 5b, and where a cover 37 closes the formed U-shape after the conductor 50a-c is inserted therein.

The encapsulation 11 is preferably of a material, such as plastic, which protects the components of the identification unit 10 against impact, dust, moisture, etc. It can further be made of an electromagnetic shielding material.

The width/circumference of the encapsulating unit 11/identification unit 10 is adapted to the width/circumference of the relevant conductor 50a-c.

In a further embodiment, not shown, the fastening device 30, at the top of the U-shape, can be provided with a pocket for arrangement of the encapsulation 11

In a further embodiment, not shown, the fastening device 30 can be of the type stocking which must be drawn on the conductor 50a-c from an end. This however requires that the conductor 50a-c is disconnected from the coupling point 51 to enable arrangement of the stocking.

With the above described identification unit 10, unskilled personnel can install the system as this requires no intervention in the electrical system, as the identification units 10 are arranged to surfaces of the conductors 50a-c.

It should be noted that if one in addition desire to monitor coupling points 51, this requires use of skilled personnel, as this requires intervention in the electrical plant.

Figure 6:
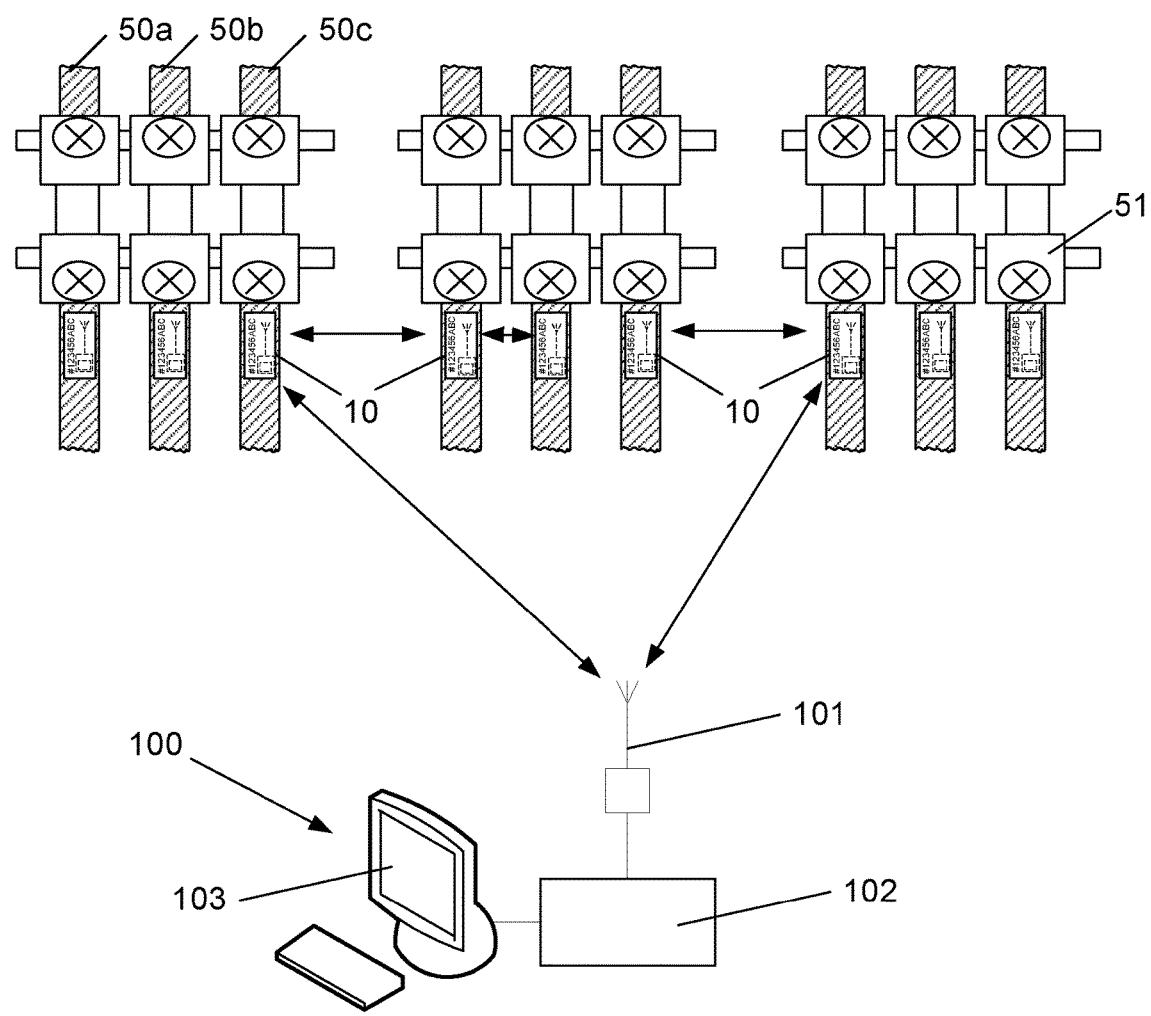
FIG. 6 shows a general drawing over data and communication flow in the identification system.

With such a fastening device one can easily arrange the disclosed embodiments to existing and new conductors without intervention in the installation or disconnecting the installation. It will also be fully possible to arrange the identification unit 10 even if the plant is under voltage/in operation. Reference is now made to FIG. 6 which shows a general drawing over data and communication flow in an identification system according to the disclosure. The identification system according to the disclosure includes a central unit 100 including an antenna 101 and a reader unit 102, and that the central unit 100 is provided with means and/or software for communication with the identification units 10, and processing and evaluating measured temperature values and possibly current values. Alternatively, the central unit can be arranged for communication with the identification units 10 via power line communication.

The central unit 100 can further include a monitor 103 for providing messages about the state of the electrical plant. In one embodiment the central unit 100 can be connected to a communication unit (not shown) to be able to communicate with other monitoring systems or a monitoring central.

The identification system work in the way that conductors 50a-c and possibly coupling points 51 which are desired to monitor are provided with an identification unit 10 as described above. Next, these are registered in the central unit 100 with their unique code and which circuit of the electrical plant they belong to. At the same time it is entered which coupling points 51 and conductors 50a-c which belong together and which it is desirable to monitor the difference between. At the end, temperature limits, temperature difference limits, frequency of measurements, etc. are set.

Communication in the identification system according to the disclosure can be set to be both active and/or passive. From an energy point of view, it is most preferable that the communication is performed in a passive way, where the central unit 100 transmits a signal in the form of an inductive field which induces operational voltage in the electronic tag 13 (FID-chip) which then activates the temperature sensor(s) 14 which perform measurements and the electronic tag 13 transmits its identification together with measured temperatures back to the reader unit 102 of the central unit 100. In other words, it will be the central unit 100 which is arranged for determining when measurements are to be performed and performs all evaluations. By an active solution, this will require that the identification unit 10 includes an energy supply, preferably in the form of internal batteries, but also external energy sources by means of energy harvesting, e.g. from RF-energy, electromagnetic field, solar cell, thermal energy, vibration, current transducer or similar, can be used. The means for energy harvesting or external energy sources are preferably arranged for charging the batteries, such that the identification system at all times will be operative. With an active solution the identification unit 10 will be able to perform measurements continuously, and that it could be provided with a control unit provided with means and/or software performing several of the above mentioned functions of the central unit 100 and thus report when a deviation is present.

A passive system will have reduced range. In such cases it will be preferable that the identification units 10 transmit via other identification units 10 to achieve sufficient range to the central unit 100.

The identification unit 10 can further be arranged for monitoring its separate phase and/or coupling, and that the identification units 10 communicate mutually, and alert the central unit 100 only if the temperature in a relevant electrical conductor exceeds a given threshold-value or there are too high deviations between the phases.

In an alternative embodiment the temperature sensors 14 measure at given intervals and reports when the communication means are activated as described above.

The temperature deviation can be analyzed by that the central unit 100 is provided with means and/or software for this and thus reveals if there is danger for overheating, fire or operational deviation. As mentioned above this can also be implemented locally in the identification unit 10, if it is provided with a control unit. This is performed by that temperatures are compared with given threshold-values.

The central unit 100 is further provided with software and/or means for comparing the registered temperature values with given reference values. The central unit 100 is further arranged for comparing if separate phases on the same fuse have higher temperature values than the others. This is usually an indication of fault, even if the measured temperature values lie below temperatures indicating danger for fire. This function can also be implemented in identification units 10 provided with a control unit.

The central unit 100 is further provided with means and/or software for evaluating measured current in the conductor together with the temperature to quality assurance the measuring result. By phase comparison it can be advantageous to know the drawn current on each phase, as higher current naturally results in increased temperature in conductor/coupling point.

The central unit 100 is further preferably arranged for comparing the measured temperature values with historical data, and control if there are indications of temperature development over time. Historical data are preferably stored in the central unit for evaluation of temperature development over time.

If a fault has occurred, this will be alerted, for example, via the monitor or via the communication unit, such that action can be taken for correcting the fault and thus prevent fire and damage of the plant.

By that the identification unit 10 is provided with a panel 16 or an optical indicator 15, this results in that an electrical engineer/operator easily can identify which of the conductors which has a fault by that this is visually easily visible in the electrical plant. In this way one can rapidly find the correct conductor and repair the fault. Another advantage with a panel 16 is that it can produce a fault code which provides personnel information of how the fault can be repaired.

This also makes it possible for unskilled personnel to disconnect the relevant circuits by that they can disconnect the fuse of the relevant circuit so that this is disconnected until skilled personnel come and repair the fault.

Further, the central unit 100 can be arranged for GMS communication or another communication unit arranged for GMS communication can be arranged in the identification system, which enables warning directly to e.g. a mobile phone for personnel on duty, such that a rapid response is ensured.

MODIFICATIONS

Even if the above described identification unit is described as an identification unit being arranged on exterior surface of a conductor, it should be mentioned that a modification is to integrate the identification unit 10 in end sleeves/caps of the conductor 50a-c or cable shoe of the conductor 50a-c. This has however the disadvantage that skilled personnel must install and maintain the system.

The invention claimed is:

1. An identification system for preventing damage to one or both of electrical conductors (50a-c) and coupling points (51), comprising
at least one identification unit (10) for arrangement to a surface, end cap or cable shoe of an electrical conductor (50a-c), the identification unit (10) having an encapsulation (11) for arrangement of the identification unit (10) to the electrical conductor (50a-c), and for housing at least one visual tag (12, 16) and electronic tag (13), wherein electronic tagging (13) and temperature measurement are integrated into the same identification unit (10) in the form of a miniaturized temperature sensor (14) having wireless communication and drawing operating voltage from batteries or induction circuits via the electronic tag (13).

2. The identification system of claim 1, wherein the identification unit (10) further includes means (17) for measuring temperature or current in a coupling point (51) of the conductor (50a-c).

3. The identification system of claim 2, wherein the identification unit (10) is configured for determining whether there is danger of overheating, fire or operational deviation via one or more of the following:
 (a) checking if the temperature in a relevant electrical conductor (50a-c) or coupling point (51) exceeds a given threshold-value,
 (b) checking if there are deviations in temperature on different phases (50a-c) on the same circuit and if the deviation is higher than a given threshold value,
 (c) checking if there is a temperature difference against other coupling points of the phase, and
 (d) checking if there is deviation in temperature in electrical conductor (50a-c) and coupling point (51) for the electric conductor and if the deviation is higher than a threshold- value.

4. The identification system of claim 1, wherein the electronic tag (13) is configured for wireless communication.

5. The identification system of claim 1, wherein the identification unit (10) further includes an advanced measuring probe (17) as a measuring point for connection to a coupling point (51) of the electrical conductor (50a-c).

6. The identification system of claim 1, wherein the identification unit (10) further comprises an energy supply in the form of batteries or is supplied with energy from an external energy source.

7. The identification system of claim 6, wherein the identification unit (10) includes means for energy harvesting, such as from RF-energy, electromagnetic field, solar cell, thermal energy, vibration or current transducer, for charging of the batteries.

8. The identification system of claim 1, wherein the identification unit (10) includes a current transducer for measuring current running through the electrical conductor (50a-c).

9. The identification system of claim 1, wherein the identification unit (10) includes a ferrite core configured for both measuring temperature and current, and for suppressing noise on the electrical conductor (50a-c).

10. The identification system of claim 1, wherein the identification unit (10) includes an optical indicator (15).

11. The identification system of claim 1, wherein the identification unit (10) includes a graphic panel (16).

12. The identification system of claim 1, wherein the identification unit (10) encapsulation (11) is configured for detachable or fixed fastening of the identification unit (10) to the electrical conductor (50a-c).

13. The identification system of claim 12, wherein the identification unit (10) is fastenable to the electrical conductor (50a-c) via double-sided tape, glue, strips or clips.

14. The identification system of claim 12, wherein the encapsulation (11) is attached to or integrated in a fastening device (30) for detachable fastening to the electrical conductor (50a-c).

15. The identification system of claim 12, wherein the fastening device (30) includes a flexible opening formed by elastic elements (31a-b) which allow insertion of an electrical conductor (50a-c) therein, or a housing (32) which exhibits an opening closed by a cover (37) after the electrical conductor (50a-c) is inserted therein.

16. The identification system of claim 1, wherein the identification unit (10) includes means or software for processing, evaluating and reporting at least one of measured temperature values and current values.

17. The identification system of claim 1, characterized in that the identification units (10) are configured for mutual communication.

18. The identification system of claim 1, wherein the identification system further includes a central unit (100) with an antenna (101) and a reader unit (102), the central unit (100) including means or software for processing, evaluating and reporting at least one of measured temperature values and current values.

19. The identification system of claim 1, wherein the identification unit (10) is configured for determining whether there is danger of overheating, fire or operational deviation via one or more of the following:
 (a) checking if the temperature in a relevant electrical conductor (50a-c) or coupling point (51) exceeds a given threshold-value,
 (b) checking if there are deviations in temperature on different phases (50a-c) on the same circuit and if the deviation is higher than a given threshold value,
 (c) checking if there is a temperature difference against other coupling points of the phase, and
 (d) checking if there is deviation in temperature in electrical conductor (50a-c) and coupling point (51) for the electric conductor and if the deviation is higher than a threshold- value.

20. An identification system for preventing damage to one or both of electrical conductors (50a-c) and coupling points (51), comprising
 at least one identification unit (10) for arrangement to a surface, end cap or cable shoe of an electrical conductor (50a-c), the identification unit (10) having an encapsulation (11) for arrangement of the identification unit (10) to the electrical conductor (50a-c), and for housing at least one visual tag (12, 16) and electronic tag (13),
 wherein the identification unit (10) further includes a ferrite core configured for both measuring temperature and current and for suppressing noise on the electrical conductor (50a-c).

* * * * *